(12) United States Patent
Schwarze et al.

(10) Patent No.: US 11,007,575 B2
(45) Date of Patent: May 18, 2021

(54) METHOD FOR PRODUCING A SINGLE-CRYSTALLINE WORKPIECE

(71) Applicant: SLM Solutions Group AG, Luebeck (DE)

(72) Inventors: Dieter Schwarze, Luebeck (DE); Jiachun Chen, Luebeck (DE)

(73) Assignee: SLM Solutions Group AG, Luebeck (DE)

( * ) Notice: Subject to any disclaimer, the term of this patent is extended or adjusted under 35 U.S.C. 154(b) by 212 days.

(21) Appl. No.: 16/139,914

(22) Filed: Sep. 24, 2018

(65) Prior Publication Data

US 2019/0255613 A1 Aug. 22, 2019

(30) Foreign Application Priority Data

Sep. 22, 2017 (EP) .................................... 17192563

(51) Int. Cl.
| | |
|---|---|
| *B22F 10/20* | (2021.01) |
| *C30B 13/00* | (2006.01) |
| *B33Y 50/02* | (2015.01) |
| *B33Y 10/00* | (2015.01) |
| *B22F 10/30* | (2021.01) |

(Continued)

(52) U.S. Cl.
CPC ............. *B22F 10/20* (2021.01); *B23P 6/007* (2013.01); *B33Y 50/02* (2014.12); *C30B 13/00* (2013.01);
(Continued)

(58) Field of Classification Search
None
See application file for complete search history.

(56) References Cited

U.S. PATENT DOCUMENTS

| | | | |
|---|---|---|---|
| 2002/0128714 A1 | 9/2002 | Manasas et al. | |
| 2014/0154088 A1* | 6/2014 | Etter | B23K 15/0086 |
| | | | 416/223 R |

(Continued)

FOREIGN PATENT DOCUMENTS

| | | |
|---|---|---|
| DE | 102016218887 A1 | 3/2018 |
| EP | 2335848 A1 | 6/2011 |

(Continued)

OTHER PUBLICATIONS

Guan et al, "Effects of Processing Parameters on Tensile Properties of Selective Laser Melted 304 Stainless Steel", Materials and Design, vol. 50, p. 581-586, Mar. 27, 2013 (Year: 2013).*

(Continued)

*Primary Examiner* — Anthony J Zimmer
*Assistant Examiner* — Dean Mazzola
(74) *Attorney, Agent, or Firm* — Taft Stettinius & Hollister LLP

(57) ABSTRACT

A method for producing or repairing a three-dimensional workpiece, the method including: depositing a sequence of layers of a raw material powder onto a substrate; after depositing a raw material powder layer, irradiating selected areas of the deposited raw material powder layer with an electromagnetic or particle radiation beam in a site selective manner in accordance with an irradiation pattern which corresponds to a geometry of at least part of a layer of the three-dimensional workpiece to be produced, the irradiation pattern including a scan pattern, wherein the substrate has a substantially single-crystalline microstructure; the irradiation is controlled so as to maintain the single-crystalline microstructure and to produce a metallurgical bond between sites of the raw material powder layer that are irradiated and the substrate and/or a previously deposited raw material powder layer, defining the scan pattern, so as to be one of a (Continued)

unidirectional or two directional scan pattern, rotating the scan pattern between two subsequently deposited raw material powder layers by a predetermined angle.

4 Claims, 3 Drawing Sheets

(51) Int. Cl.
    *C30B 29/52*     (2006.01)
    *B23P 6/00*     (2006.01)
    *F01D 5/00*     (2006.01)
    *B33Y 30/00*     (2015.01)
    *B33Y 70/00*     (2020.01)
    *B22F 5/04*     (2006.01)

(52) U.S. Cl.
    CPC .............. *C30B 29/52* (2013.01); *F01D 5/005* (2013.01); *B22F 5/04* (2013.01); *B22F 10/30* (2021.01); *B22F 2202/05* (2013.01); *B22F 2998/10* (2013.01); *B33Y 10/00* (2014.12); *B33Y 30/00* (2014.12); *B33Y 70/00* (2014.12); *F05D 2230/31* (2013.01)

(56) References Cited

U.S. PATENT DOCUMENTS

| | | | | |
|---|---|---|---|---|
| 2014/0163717 A1* | 6/2014 | Das | ........................ | B33Y 10/00 700/119 |
| 2014/0242400 A1* | 8/2014 | Hoebel | .............. | B23K 26/0093 428/457 |
| 2016/0158889 A1* | 6/2016 | Carter | .................... | G02B 6/425 219/76.12 |
| 2019/0048722 A1* | 2/2019 | Srinivasan | ......... | B23K 26/0093 |

FOREIGN PATENT DOCUMENTS

| | | |
|---|---|---|
| EP | 2737965 A1 | 6/2014 |
| EP | 2772329 A1 | 9/2014 |
| WO | 2014/131444 A1 | 9/2014 |

OTHER PUBLICATIONS

Chen et al., Grain Growth During Selective Laser melting of a Co—Cr—Mo Alloy, Journal of Materials Science, Kluwer Academic Publishers, vol. 62, No. 12, Mar. 10, 2017 (14 pages).

Guan et al., Effects of Processing Parameters on Tensile Properties of Selective Laser Melted 304 Stainless Steel, Materials and Design, vol. 50, Mar. 27, 2013 (6 pages).

Hunt, J.D., Steady State Columnar and Equiaxed Growth of Dendrites and Eutectic, Materials Science and Engineering, vol. 85, Sep. 1984 (9 pages).

European Patent Office, European Search Report dated Feb. 28, 2018 issued in related patent application EP 17192563.9 (16 pages).

European Patent Office, Official Action in corresponding EP Application No. 17192563.9, dated Nov. 13, 2018, 9 pages.

* cited by examiner

METHOD FOR PRODUCING A SINGLE-CRYSTALLINE WORKPIECE

The present invention relates to a method and apparatus for producing a single-crystalline workpiece by irradiating layers of a raw material powder with electromagnetic or particle radiation.

Powder bed fusion is an additive layering process by which pulverulent, in particular metallic and/or ceramic raw materials can be processed to three-dimensional workpieces of complex shapes. To that end, a raw material powder layer is applied onto a carrier and subjected to laser radiation in a site selective manner in dependence on the desired geometry of the workpiece that is to be produced. The laser radiation penetrating into the powder layer causes heating and consequently melting or sintering of the raw material powder particles. Further raw material powder layers are then applied successively to the layer on the carrier that has already been subjected to laser treatment, until the workpiece has the desired shape and size. Powder bed fusion may be employed for the production of prototypes, tools, replacement parts, high value components or medical prostheses, such as, for example, dental or orthopaedic prostheses, on the basis of CAD data.

The thermal and mechanical properties of metallic workpieces typically strongly depend on the microstructure of the workpieces. For example, single crystalline metallic materials, in particular stainless steels or Ni, Co or Fe based superalloys, exhibit excellent mechanical, chemical and thermal properties even at elevated temperatures. These materials are therefore commonly used for manufacturing components subjected to high mechanical and thermal loads such as, for example, turbine blades or engine parts.

WO 2014/131444 A1 discloses an apparatus for producing three-dimensional workpieces which comprises a carrier, a powder application device for applying a raw material powder onto the carrier, an irradiation device for selectively irradiating electromagnetic or particle radiation onto the raw material powder applied onto the carrier, and a control unit which controls the operation of the powder application device and the irradiation device in dependence on the crystallization behavior of the raw material powder, in order to tailor the microstructure of a workpiece made of said raw material powder by an additive layer construction method. In particular, the control unit controls a radiation source and/or an optical unit of the irradiation device so as to adjust a beam size, a beam profile and/or other irradiation parameters of a radiation beam irradiated onto the raw material powder applied onto the carrier or an output of the radiation source in dependence on the crystallization behavior of the raw material powder, in order to tailor the microstructure of the workpiece. Thereby, a workpiece having a substantially single crystalline or directionally/dendritically solidified microstructure may be obtained.

The invention is directed at the object of providing a solution which allows the generation of a high-quality single-crystalline three-dimensional workpieces by irradiating layers of a raw material powder with electromagnetic or particle radiation.

This object is addressed by a method as defined in the claims.

A method for producing or repairing a three-dimensional workpiece is proposed, the method comprising the step of depositing a sequence of layers of a raw material powder onto a substrate. The substrate may cover at least part of a build area, on which the workpiece is to be produced. The build area may be defined by and/or correspond to a surface of a carrier on which the substrate may be arranged in order to deposit raw material powder thereon. Accordingly, the build area may correspond to a maximum cross sectional area or a footprint of a workpiece that can be produced or repaired.

The substrate may further be arranged on a carrier of an apparatus used for carrying out the method. Said carrier may be a rigidly fixed carrier. Preferably, however, the carrier is designed to be displaceable in vertical direction so that, with increasing construction height of a workpiece, as it is built up in layers from the raw material powder, the carrier can be moved downwards in the vertical direction.

As detailed below, the substrate may thus be provided in the form of a thin planar member. Also, the substrate may have been produced differently from an additive layer manufacturing process and, in particular, from a selective laser melting process. On the other hand, the substrate may be provided in form of a workpiece that needs to be repaired, for example, by at least partially restoring some of its workpiece layers. In this case, the substrate may have very well been produced by an additive layer manufacturing process and, in particular, a selective laser melting process.

As a general remark, producing or generating a workpiece may relate to fully producing a solidified workpiece from raw material powder, whereas repairing a workpiece may relate to only restoring selected regions of an already solidified workpiece which has been damaged. Also, a hybrid-production can be employed, e.g. by a part of the workpiece being separately produced and a remaining part being added thereto by way of the presently disclosed solution. The separately produced part may be formed e.g. by single-crystal casting.

As further detailed below, the substrate may be a substantially single-crystalline substrate. The term "substantially single crystalline", in the context of the present application, may relate to a microstructure of the substrate which is in fact single crystalline, i.e. does not comprise any grain boundaries. Yet, the expression "substantially single crystalline" should also cover a microstructure which does have grain boundaries between grains having preferred orientation, i.e. a microstructure wherein the grain boundaries extend substantially parallel to each other in a preferred direction. Such a microstructure typically is obtained by a directional solidification of metallic melts.

Due to using a single-crystalline substrate that is bonded with the raw material powder layer, a single-crystalline growth of dendrites of the melted powder material may be achieved. In particular, an epitaxial growth along the orientation of the crystalline structure of the substrate may be achieved. Hence, a single-crystalline microstructure of the produced workpiece layer can more reliably be achieved.

The raw material powder preferably is a metallic powder, in particular a metal alloy powder, but may also be a ceramic powder or a powder containing different materials. In general, the material of the substrate and the material of the raw material powder may be the same or at least belong to the same class (i.e. metallic or ceramic).

The powder may have any suitable particle size or particle size distribution. It is, however, preferable to process powders of particle sizes <100 μm. The deposition may be achieved by using a powder application device as further detailed below. The deposited raw material powder layer may cover a surface of the substrate by at least ca. 50%, by at least ca. 75% or by ca. 100%. The raw material powder layer may be used to produce a substantially complete cross-sectional area of the workpiece therefrom. On the other hand, for example in case of repairing, the layer may be used to produce (or, in other words, restore) only part of the workpiece, e.g. by restoring layers on top of remaining flat surface portion of the damaged workpiece.

The method further comprises a step of, after depositing a raw material powder layer, irradiating selected areas of said deposited raw material powder layer with an electromagnetic or particle radiation beam in a site selective manner in accordance with an irradiation pattern which corresponds to a geometry of at least part of a layer of the three-dimensional workpiece to be produced, said irradiation pattern comprising a predetermined scan pattern. Hence, the raw material powder applied onto the carrier may be subjected to electromagnetic or particle radiation in a site-selective manner in dependence on the desired geometry of the workpiece that is to be produced or repaired. The irradiation is preferably adapted to cause a site-selective melting of the raw material powder particles (i.e., performing a selective laser melting process).

The irradiation may be achieved by means of an irradiation device. The irradiation device may comprise at least one radiation source, in particular a laser source, and at least one optical unit for guiding and/or processing a radiation beam emitted by the radiation source. The radiation source may comprise a diode pumped Ytterbium fibre laser emitting laser light at a wavelength of approximately 1070 to 1080 nm. The optical unit may comprise optical elements such an object lens, in particular and f-theta lens, and a scanner unit, the scanner unit preferably comprising a diffractive optical element and a deflection mirror. For example, the irradiation device may be an irradiation device as described in EP 2 335 848 A1. For guiding the radiation beam, the optical unit may comprise an optical scanner unit, which is preferably movable about at least two axes. The irradiation device may also comprise a plurality of radiation sources, such as single laser diodes, which are arranged in form of an array or matrix. These may jointly be controlled to produce dedicated radiation patterns on the deposited raw material powder. Reference is made to a corresponding solution known from DE 10 2016 218 887 (not yet published at the application date of the present disclosure).

In case of producing a three-dimensional workpiece, the irradiation pattern preferably corresponds to a complete cross-sectional layer of the three-dimensional workpiece to be produced. In case of repair, a complete surface portion that needs to be restored may be concerned.

The irradiation is controlled so as to maintain said single-crystalline microstructure and to produce a metallurgical bond between irradiated sites of the raw material powder layer and the substrate and/or a previously deposited raw material powder layer. The metallurgical bond may result from melting part of the raw material powder layer as well as at least the surface and especially a thin surface layer of the substrate on which the raw material powder is deposited. Similarly, the metallurgical bond may be formed between the irradiated and a previously deposited raw material powder layer. For example, a surface layer of the substrate (or a previously deposited raw material powder) may be melted, said layer having a thickness of less than ca. 0.5 mm or less than 0.05 mm. Thereby, a common melt pool may be formed between the substrate or the previously deposited raw material powder and the presently irradiated raw material powder. Said melt pool may then solidify to form the metallurgical bond, preferably, under formation of the desired single-crystalline microstructure. For producing the metallurgical bond, the irradiation may be controlled so as to achieve a desired melting behaviour, such as a melting depth or melting volume. Suitable values can be determined by way of simulations or experiments, for example, in dependence of the used materials, the layer or substrate thickness and the like.

Also, in order to maintain the single crystalline microstructure or, in other words, continue said microstructure throughout the produced workpiece, suitable parameter settings may be derived from the earlier cited prior art e.g. in form of WO 2014/131444 A1.

In a generally known manner, the scan pattern of the irradiation may include a predetermined arrangement of scan or hatch vectors along of which a beam is moved over the raw material powder. The scan pattern may substantially cover or fill the layer of the workpiece that is to be produced. As further detailed below, the scan pattern may e. g. comprise a plurality of straight and parallel scan vectors which are equidistantly arranged next to one another.

According to the present method, the scan pattern is defined so as to be one of a unidirectional or two directional scan pattern. Also, a rotation angle of the scan pattern is chosen, for example, in dependence of the applied scan pattern. As further detailed below, when applying a unidirectional scan pattern, said pattern may be rotated between two subsequently deposited or, in other words, adjacent raw material powder layers by e.g. 0°, 90°, 180° or 270°. In case of a two directional scan patterns, a rotation of 0°, 90°, 180° or 270° may be realised. For each of these angles, a tolerance of +/−15° may be applied (e.g. the angle lying between −15° and +15°, between 75° and 105°, between 165° and 195° or between 255° and 285° for the unidirectional scan pattern). The fact that scan patterns may be rotated between adjacent raw material powder layers is generally known in the art, however, not in connection with and not for the presently taught purpose of producing single crystalline workpieces, let alone when considering the specific values noted above. The rotation angles may be determined by comparing the relative arrangement of the scan vectors between the scan patterns of said adjacent layers. Also, the rotation angles (i.e., the relative rotation) may generally be measured in a counter-clockwise or in a clockwise direction.

Note that the invention may contemplate choosing different rotation angles after at least every second, at least every fifth, at least every tenth, at least every twentieth or at least every fiftieth layer, wherein the rotation angles may again be chosen from the previously mentioned examples. In other words, after a predetermined number of layers, a switch with regard to the applied rotation angle may take place. On the other hand, choosing a consistent non-varying rotation angle is equally possible, e.g. a constant angle of 0° or 90°.

Unless indicated to the contrary, discussions on forming, processing and/or irradiating a raw material powder layer may, according to the present disclosure, apply to at least half or even each of a respective sequence of raw material powder layers. In particular, such discussions may relate to at least ca. 50%, at least ca. 75% or ca. 100% of the total number of raw material powder layers used for producing or repairing a workpiece. For example, the previously discussed rotation of scan patterns between adjacent layers may apply to at least half of or even to each of a sequence of raw material powder layers used for producing or repairing a workpiece.

As indicated above, the scan pattern may comprise a plurality of scan vectors, each scan vector preferably having a substantially straight course. The scan vectors may also be equidistantly spaced apart from one another, thus for example defining a stripe pattern. The direction in which the vectors point may indicate a direction in which the irradiation beam is moved when irradiating the raw material powder.

According to one example, the scan vectors extend unidirectionally. To put it differently, the scan vectors may each point in the same direction.

Alternatively, the scan vectors may extend two directionally, for example, by pointing in opposite directions. Specifically, adjacent scan vectors may point in different directions, thus creating a regular two-directional scan pattern.

In one embodiment, the scan pattern is two directional and the method further comprises the step of: orienting the scan pattern with respect to a crystal orientation of the substrate in a predetermined manner. The predetermined crystal orientation of the single crystal substrate (e.g. a [1 0 0] orientation, [0 1 0] orientation, [−1 0 0] and [0 −1 0] orientation, see below) may be determined by way of experiment (e.g. by etching or other microscopic methods). According to one example, each of the scan vectors extends at or confines a respective angle with the predetermined crystal orientation. This orientation may be maintained at least for irradiating the first raw material powder layer which is directly deposited onto the substrate.

In a generally known manner, the predetermined crystal orientation may relate to a predetermined direction within the microstructure of the substrate, e.g. a direction extending perpendicularly to the main growth direction along the build or height axis of workpiece. This latter axis typically forms a Z-axis and/or represents the axis along which the raw material powder layers are stacked on top of one another. In one example, the predetermined crystal orientation represents and/or includes a growth direction of secondary dendrite arms.

According to a further aspect, the two directional scan pattern extends at angle of 45° with respect to a predetermined crystal orientation of the substrate, said angle having a tolerance of +/−15° and, preferably, wherein said crystal orientation is one of a [1 0 0] orientation, [0 1 0] orientation, [−1 0 0] and [0 −1 0] orientation. The rotation may be chosen so as to be 0° between subsequent layers. Yet, different values are likewise conceivable. The crystal orientations relate, for example, to a generally known coordinate system in which the main build axis or main growth direction defines a [0 0 1] orientation (e.g. corresponding to primary dendrite growth direction of the single crystal substrate).

Furthermore, for the two directional scan pattern, the substrate may be arranged so that the [0 0 1] orientation matches a build axis of the workpiece.

According to different embodiment, the scan pattern is unidirectional and the scan pattern is rotated by an angle of 90°, 180° or 270°, said angle having a tolerance of +/−15°. In this context, the substrate may be arranged so that the [0 0 1] orientation matches a build axis of the workpiece.

Furthermore, in case the unidirectional scan pattern is rotated by an angle of 0° (e.g. throughout the whole workpiece), the substrate may be arranged so that the [0 0 1] orientation is non-parallel to a build axis of the workpiece.

For both of the above discussed examples of orienting the substrate with respect to the build axis, the preferred growth direction in three-dimensions of the deposited raw material may be identified in advance, for example, by means of pre-experiments, and the crystal orientation of the single-crystal substrate may be matched to the preferred growth direction of the deposited raw material in three-dimensions. Note that in the context of the present disclosure, the term match may indicate a correspondence and/or congruence of the relevant entities.

In the following, possible further embodiments and optional features are discussed. These may be used in connection with the present method but also in connection with the subsequently defined apparatus.

As already mentioned above, the method may further comprise the step of adjusting the crystal orientation of the substrate so it substantially corresponds to the build axis. Accordingly, the [0 0 1] direction of said substrate may also extend substantially vertically in space and/or along a respective Z-axis (i. e., in two directional scanning or in unidirectional scanning with a rotation angle of 90°, 180° or 270°). Overall, as a result of irradiating the raw material powder, this may promote a crystal growth taking place along the build axis in order to produce a respectively oriented single-crystalline workpiece layer.

Additionally or alternatively, the method may comprise the step of adjusting a crystal orientation of the single-crystalline substrate and a grain growth direction in the layer of the three-dimensional workpiece occurring upon irradiating said layer so as to correspond to one another. This may be achieved by adjusting a position and/or orientation of the substrate prior to depositing and irradiating raw material powder thereon. In this context, selecting the substrate's position and/or orientation may be subject to an expected or predetermined grain growth direction (i.e. preferred growth direction), which may be influenced by selecting suitable irradiation parameters. Alternatively, the grain growth direction may be controlled depending on a known crystal orientation of the (preferably single-crystalline) substrate. Again, this may be achieved by selecting suitable irradiation parameters. Of course, both of the substrate's crystal orientation as well as the grain growth direction may substantially correspond to a build axis of the workpiece.

According to a further aspect, at least one of the following parameters is used for controlling the irradiation:
 a beam size, a defocusing state and/or a beam profile of the electromagnetic or particle radiation beam,
 an exposure time of the selected areas of a deposited raw material powder to the electromagnetic or particle radiation beam,
 a speed of moving an irradiation site across a deposited raw material powder layer,
 a remelting rate along the build axis and/or within the plane of a presently irradiated raw material powder layer,
 an energy input of the electromagnetic or particle radiation beam into the selected areas of the raw material powder layer applied onto the substrate, and
 the rotation angle,
 the hatch distance (i.e., a distance between adjacent scan vectors).

Another parameter according to or, differently put, as a function of which the irradiation may be controlled is the thickness of the raw material powder layers.

Using the above parameters for controlling the irradiation may include setting them to suitable values and/or varying them appropriately before, during or after irradiation.

The beam size may relate to a diameter or area of the beam, in particular with respect to a cross-sectional area thereof when impinging or impacting the raw material powder layer. In general, said diameter or area may be increased under the control of the control unit in order to promote the occurrence of a low solidification or crystal growth velocity in combination with a high temperature gradient in the melt produced by irradiating the powder and to thus obtain a substantially single crystalline microstructure in the generated workpiece layer. In general, according to the present disclosure, a high temperature gradient may be set in the melt with regard to the build axis. Specifically, such a temperature gradient may be set in a positive direction along the build axis (e.g. a positive Z-direction).

Preferably, the beam diameter of a radiation beam emitted by a radiation source and processed by an optical unit may be set to ≤100 μm, in particular ≤500 μm and specifically ≥750 μm in order to obtain a substantially single crystalline or directionally/dendritically solidified microstructure in the generated workpiece.

The defocusing state may relate to a deliberate deviation from an ideal focusing state of the radiation beam, e.g. by adjusting a focus position of said beam to be at a distance to an upper surface of the raw material powder layer that should be irradiated. As is generally known, the radiation beam may thus impinge or impact the raw material powder layer in an out-of-focus-state to, for example, limit the energy input into the raw material powder.

The beam profile may generally relate to an intensity profile or intensity distribution of the radiation beam, e.g. transversely across its cross-section. Accordingly, it may include an as such known top-hat-intensity profile, Gaussian or ring-shaped donut profile. Other profiles that are achieved by beam shaping may equally be employed.

A suitable selection of beam parameters may include choosing a top-hat beam profile with an increased beam diameter or a deliberately defocused low-diameter beam having a Gaussian profile.

The exposure time to the radiation beam may be selected so as to achieve a desired energy input and/or melting process of the raw material powder and/or the single crystalline substrate.

The irradiation pattern may include the shape or geometry of the total area which is irradiated and/or a strategy for moving an irradiation site within said area so as to cover the surface to be irradiated (e.g. by moving it along the above-discussed scan vectors extending across said surface). Such movements may be achieved by scanning a radiation beam across the raw material powder along the so-called scan or hatch vectors. Likewise, in case of using an array or matrix of e.g. laser-LED radiation sources, this may include activating adjacent radiation sources in a coordinated manner so as to subsequently irradiate dedicated spots on said raw material powder. The irradiated spots may be arranged along dedicated scan or hatch vectors, so that if being subsequently activated, movement of an irradiation site across the raw material powder along said vectors may be reproduced.

The speed of moving an irradiation site across a deposited raw material powder layer may relate to any of the above discussed movements achieved by scanning a radiation beam or by a coordinated activation of a plurality of radiation sources.

The remelting rate along the build axis may relate to a rate of remelting previously irradiated raw material powder layers (and/or the preferably single crystalline substrate) when irradiating a most recently deposited raw material powder layer. In other words, a melting depth may be concerned, which may include remelting already produced workpiece layers below of a most recently deposited and thus uppermost raw material powder layer. Accordingly, the remelting rate may be selected so as to set a remelting depth and thus an overall melt pool depth along the build axis to a desired value.

Similarly, the remelting rate within the plane of a presently irradiated raw material powder layer may relate to remelting segments of the raw material powder layer which have previously already been irradiated. Such a previous irradiation may be caused by moving an irradiation site across the raw material powder layers, for example, along dedicated scan or hatch vectors. In this context, the remelting may result from the radiation beam diameters overlapping each other when being moved along adjacent vectors. More precisely, the melt pools that are produced as a result of moving a radiation beam along adjacent scan or hatch vectors may overlap each other within the plane of a presently irradiated raw material powder layer. In this context, a melt pool produced during a run along a first vector may have at least partially solidified again during a run along an adjacent second vector. Yet, due to the overlapping beam diameters, said melt pool may at least partially be remelted again during the run along the adjacent second vector.

The energy input may further be selected so as to determine a desired melting speed, temperature distribution, solidification speed or other melting-related characteristics, so as to control the resulting microstructure of the produced workpiece layer.

According to a further aspect, the at least one parameter for controlling the irradiation is substantially constant between at least some of the subsequent raw material powder layers. To put it differently, the irradiation conditions may be maintained substantially constant at least for some of the subsequently deposited raw material powder layers out of which a sequence of workpiece layers is produced. Of course, this may also include keeping more than one irradiation parameter constant. As previously indicated, this may relate to at least ca. 50%, ca. 75% or even ca. 100% of the subsequent raw material powder layers. By maintaining constant irradiation parameters, a constant single crystalline growth in the melted materials can more reliably be achieved.

The irradiation may further be controlled in dependence on the crystallization behavior of the raw material powder in such a manner that single-crystalline layers of the three-dimensional workpiece are produced. Accordingly, the method may be used for manufacturing or repairing workpieces having a desired microstructure and, in particular, a single-crystalline microstructure. By tailoring the microstructure of the workpiece accordingly, workpieces having specific mechanical, thermal, electrical or chemical properties may be manufactured. For example, workpieces exhibiting a high mechanical, chemical and thermal resistance, in particular at elevated temperatures, may be obtained.

In general, the crystallization behavior of a melt, in particular a metallic melt, may be described, for example, by the so-called v-G-diagram, wherein the solidification or crystal growth velocity v is plotted against the temperature gradient G, typically on a double logarithmic scale. A v-G-diagram may be measured or calculated for any desired material, as it is well known in the art and described, for example, in the publication by J. D. Hunt entitled "Steady State Columnar and Equiaxed Growth of Dendrites and Eutectic", Materials Science and Engineering, Vol. 65, 1984, pages 75-83. Within the v-G-diagram, different regions of v-G-combinations are associated with different microstructural properties of the solidified melt. For example, high solidification or crystal growth velocities and low temperature gradients lead to the development of a polycrystalline globulitic microstructure, whereas low solidification or crystal growth velocities in combination with (local) undercooling of the melt due to high temperature gradients result in the formation of dendrites and single crystals. Again, in the context of the present disclosure said temperature gradient may generally be produced along the build axis and, in particular, along a negative direction of said build axis (e.g. a negative Z-direction).

The irradiation according to the present method may thus be controlled in such a manner that, in dependence on the raw material powder type, a suitable combination of the solidification or crystal growth velocity and the temperature gradient occurring in the melt produced by irradiating the powder with electromagnetic or particle radiation is obtained in order to generate the desired microstructure, e.g. a directionally solidified microstructure comprising substantially dendrites and/or single crystals. In particular, this may include generating a grain growth direction in the layer of the three-dimensional workpiece which corresponds to a crystal orientation of the (single-crystalline) substrate (e.g. by being oriented along the build axis).

For doing so, any of the above irradiation parameters and/or operating parameters of a radiation source or of a respective plurality of radiation sources as well as parameters of a possible optical unit may be selected in dependence on the crystallization behavior of the raw material powder, in order to tailor the microstructure of a workpiece made of said raw material powder by an additive layer construction method. In other words, the operation of the radiation source(s) and/or the optical unit(s) may be controlled in such a manner that, in dependence on the raw material powder and/or substrate type, a suitable combination of the solidification or crystal growth velocity and the temperature gradient occurring in the melt produced by irradiating the powder with electromagnetic or particle radiation is obtained in order to generate the desired microstructure (preferably single crystalline).

For example, the speed of moving (i.e., scanning) irradiation sites across the raw material powder layers may be decreased in order to promote the occurrence of a low solidification or crystal growth velocity in combination with a high temperature gradient in the melt produced by irradiating the powder. This may help to obtain a substantially single crystalline or directionally/dendritically solidified microstructure in the generated workpiece. Preferably, said speed may be set to less than 1 m/s.

Additionally or alternatively thereto, it is conceivable to promote the occurrence of a low solidification or crystal growth velocity in combination with a high temperature gradient in the melt and thus the formation of a substantially single crystalline microstructure by setting the distance between hatches along which the irradiation sites are arranged to a suitable value. In other words, the hatch distance may be used as a parameter for controlling the resulting microstructure in a desired manner, Preferably, the hatch distance may be set to a value that is smaller than a diameter of the applied radiation beam and/or to less than 1 mm.

Finally, an output of the radiation source, in particular a laser power of a laser source, may be controlled in such a manner that, in dependence on the raw material powder type, a suitable combination of the solidification or crystal growth velocity and the temperature gradient occurring in the melt produced by irradiating the powder is obtained in order to generate the desired single crystalline microstructure, Specifically, the output of the radiation source may be increased in order to promote the occurrence of a low solidification or crystal growth velocity in combination with a high temperature gradient in the melt and thus the formation of a substantially single crystalline microstructure in the generated workpiece. Preferably, the output of the radiation source may be set to a value larger than ca. 100 W, larger than ca. 500 W, larger than ca. 1000 W or larger than ca. 2000 W.

Moreover, the deposition of a raw material powder layer may be controlled in such a manner that, in dependence on the raw material powder type, a suitable combination of the solidification or crystal growth velocity and the temperature gradient occurring in the melt produced by irradiating the powder with electromagnetic or particle radiation is obtained in order to generate the desired microstructure. In particular, the deposition of a raw material powder layer may be controlled so as to adjust a thickness of a deposited raw material powder layer in dependence on the crystallization behavior of the raw material powder, in order to tailor the (single crystalline) microstructure of a workpiece made of said raw material powder by an additive layer construction method.

For example, the thickness of the deposited raw material powder layer may be increased, if it is desired to promote the occurrence of a low solidification or crystal growth velocity in combination with a high temperature gradient in the melt and thus the formation of a substantially single crystalline or directionally/dendritically solidified microstructure in the generated workpiece. Preferably, the thickness of the raw material powder layer applied onto the carrier may be set to range from 30 to 250 μm.

Overall, the melting point, the melting properties (for example the absence or presence of eutectic compositions in an alloy), the crystallographic structure, and further material properties of the material employed in pulverous form as the raw material for generating a workpiece strongly influence the v-G-diagram and hence the combination of the solidification or crystal growth velocity and the temperature gradient occurring in the melt produced by irradiating the powder which is suitable to obtain a desired microstructure in the workpiece, such as a single crystalline structure. Consequently, the actual irradiation parameters, the material deposition parameters (e.g. a thickness of raw material powder layers) and/or a possible preheating of the raw material powder layer that have to be adjusted in order to generate the desired microstructure in the workpiece may vary significantly in dependence on the raw material powder type.

For example, it is easily conceivable that the irradiation, preheating or material deposition parameters of the device, the powder application device and the heating device which have to be set by means of the control unit in order to generate a substantially single crystalline or directionally/dendritically solidified microstructure in a workpiece made of an Aluminum alloy significantly differ from the parameters which have to be set in order to generate a substantially single crystalline or directionally/dendritically solidified microstructure in a workpiece made of steel or an Ni, Co or Fe based superalloy. Suitable value ranges, however, may be obtained, based on the teaching of this application by experimental work as it is common to be carried out by a person skilled in art.

According to the present invention, the irradiation can be controlled so that a remelting rate along the build axis $R_z$ fulfills the following condition: $R_z > 0.3$, with $R_z = ((D-l_z)/D)$, $l_z$ being the layer thickness of the presently irradiated raw material powder layer and $D$ being a melt pool depth occurring as a result of the irradiation. As previously discussed, the remelting rate may relate to at least partially melting an already produced workpiece layer (and/or the preferably single crystalline substrate), on top of which a most recently and thus uppermost raw material powder layer has been deposited. The layer thickness lz of the deposited raw material powder layers may be uniform throughout the complete production or repairing process. The melt pool depth D may relate to a depth measured along the build axis and/or concern the depth of molten material formed by irradiating the raw material powder.

Additionally or alternatively, the irradiation can be controlled so that a remelting rate within the plane of a presently irradiated raw material powder layer Rx fulfills the following condition: Rx>0.3, with Rx=((W−dy)/W), W being a melt pool width and dy being a distance between adjacent irradiation sites of the raw material powder layer. The melt pool width W may be measured within the plane of the presently irradiated raw material powder layer and, for example, extend substantially perpendicularly to the melt pool depth D. The distance dy may relate to or be defined by adjacent vectors along which respective irradiation sites are arranged, said vectors forming scan or hatch vectors as previously discussed. Accordingly, material that has been molten and solidified by a movement along a first vector may be at least partially re-molten by a movement along a preferably directly adjacent second vector.

The inventor has discovered that if fulfilling any of the above conditions with regard to the remelting rates, a single crystalline microstructure of the generated workpiece can more reliably be achieved.

According to a further example, the substrate fulfils at least one of the following conditions:
- the substrate covers at least ca. 0.1%, at least ca. 10%, at least ca. 25%, at least ca. 50%, at least ca. 75% or ca. 100% of a build area that is available for producing or repairing the workpiece;
- the substrate is configured as a substantially planar member and, for example, defines a substantially rectangular plane;
- a thickness of the substrate along the build axis is not more than ca. 1000 mm, not more than ca. 200 mm, not more than ca. 100 mm, not more than ca. 50 mm or not more than ca. 10 mm,
- the substrate is a single crystal workpiece which, for example, needs to be repaired.

If providing the substrate as a planar member, the plane defined thereby may be arrangeable so as to extend substantially in parallel to a carrier and/or the build area discussed above. The same may apply to raw material powder layers which are deposited on said substrate.

To the contrary, in case of being provided as a workpiece to be repaired, the substrate may assume a more complex three-dimensional form and comprise certain regions in which workpiece layers need to be restored, e.g. by starting from a remaining planar material surface and re-adding material layers on top thereof. The workpiece to be repaired may have been formed by solidifying raw material powder layers, e.g. by selective laser melting.

The method may further comprise the step of separating the produced workpiece from the substrate and, optionally, re-using the substrate for the production of a further workpiece. Separation from the substrate may be necessary to overcome the metallurgical bond. The separation may involve a step of cutting through a boundary or melting region between the workpiece and the substrate. Additionally or alternatively, mechanical forces may be applied, e.g. for pulling the substrate and workpiece apart. As only a thin substrate layer might have been melted to the workpiece for producing the metallurgical bond, the substrate may be re-used for the production of further workpiece. Said further workpiece may be produced similarly to the above method steps.

The method may further comprise the step of pre-heating a deposited raw material powder layer prior to irradiating it for producing a workpiece layer. This may relate to the first raw material powder layer or any of a possible sequence of further raw material powder layers being deposited and irradiated. Preheating may be achieved by a separate pre-heating device or by a radiation beam emitted by the same irradiation device used for actually irradiating (and melting) the raw material powder for producing a workpiece layer. The preheating temperature of the raw material powder may be selected in dependence on the crystallization behavior of the raw material powder, in order to tailor the microstructure of a workpiece made of said raw material powder by a additive layer construction method.

Furthermore, the use of a (single-crystalline) substrate as a substrate for depositing raw material powder thereon is proposed, said raw material powder layer being irradiated for producing or repairing a three-dimensional workpiece according to an additive layering process, such as selective laser melting. Of course, the additive layering process may include depositing and irradiating single raw material powder layers as discussed above. The use may further include any of the above features, steps or aspects for providing any of the related effects or operating states. For example, the use may further include using a preferably single crystalline substrate for an additive layering process, such as selective laser melting, wherein a crystal orientation of the (preferably single-crystalline) substrate substantially corresponds to a build axis of the workpiece to be produced or repaired.

Still further, an apparatus is proposed for producing or repairing a three-dimensional workpiece, the apparatus comprising or being configured to receive at least one substrate having a substantially single-crystalline microstructure; and the apparatus further comprising:
- a powder application device adapted to depositing a sequence of layers onto the substrate;
- an irradiation device adapted to, after depositing a raw material powder layer, irradiating selected areas of the deposited raw material powder layer with an electromagnetic or particle radiation beam in a site selective manner in accordance with an irradiation pattern which corresponds to a geometry of a layer of the three-dimensional workpiece to be produced, said irradiation pattern comprising one of a unidirectional or two directional scan pattern; and
- a control unit adapted to controlling the irradiation device so as to maintain said single-crystalline microstructure and to produce a metallurgical bond between irradiated sites of the raw material powder layer and the substrate and/or a previously deposited raw material powder layer, wherein the control unit is adapted to set a rotation angle of the scan pattern between two subsequently deposited raw material powder layers.

The apparatus may comprise any of the previously or subsequently discussed features, devices, units or other aspects. This relates in particular to any features, devices or units being necessary to achieve any of the previously or subsequently discussed effects or operating states or to perform any of the relevant method steps.

For example, the apparatus may comprise a separating device for separating the substrate and workpiece layers after completing production or repairing of the workpiece. Also, a suitable scanning unit may be provided for realising the desired scan patterns.

Moreover, the following further embodiments may be provided whose features are largely discussed in detail above with respect to the presently disclosed method. For example, the scan pattern may be two directional and the control unit may be further configured to orient the scan pattern with respect to a crystal orientation of the substrate in a predetermined manner.

Also, in connection with the above apparatus, the scan pattern may comprise a plurality of scan vectors, each scan vector preferably having a substantially straight course.

Moreover, when applying a two directional scan pattern, said pattern may extend at angle of 45° with respect to a predetermined crystal orientation of the substrate, said angle having a tolerance of +/−15°. This may relate at least to the first raw material powder layer which is directly deposited onto the substrate, e.g. prior to possible rotations taking place. Also, said crystal orientation may be one of a [1 0 0] orientation, [0 1 0] orientation, [−1 0 0] and [0 −1 0] orientation.

According to an alternative embodiment, the scan pattern is unidirectional and the scan pattern is rotated by an angle of 0°, 90°, 180° or 270°, said angle having a tolerance of +/−15°. In this context, the apparatus may be configured to enable any of the further unidirectional scanning strategies discussed above in connection which the presently disclosed method.

In the following, preferred embodiments of the invention are explained in greater detail with reference to the accompanying schematic drawings, in which.

Figure 1:
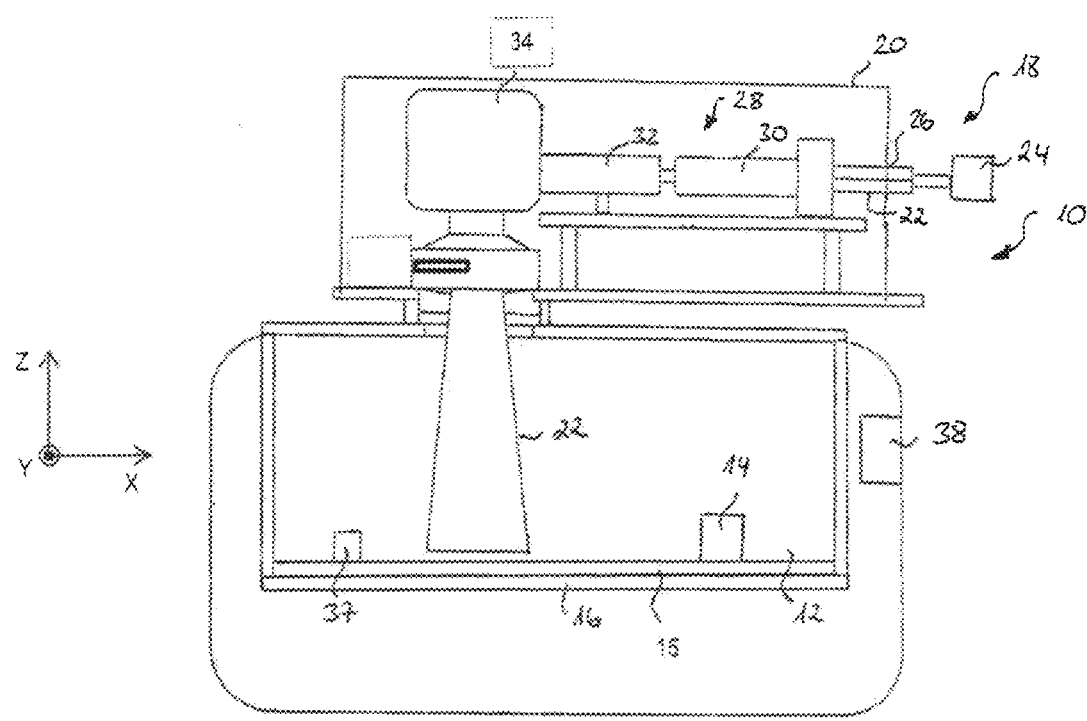
FIG. 1 shows an apparatus for producing three-dimensional workpieces.

FIG. 1 shows an apparatus 10 for producing three-dimensional workpieces by selective laser melting (SLM®). The apparatus 10 comprises a process chamber 12 which may be sealed against the ambient atmosphere such that an inert gas atmosphere, for example an Argon atmosphere, may be established within the process chamber 12. A powder application device 14 serves to apply a raw material powder by releasing it above a carrier 16. The carrier 16 is designed to be displaceable in vertical direction so that, with increasing construction height of a workpiece, as it is built up in layers from the raw material powder on the carrier 16, the carrier 16 can be moved downwards in the vertical direction (in a negative Z-direction).

On top of the carrier, a single-crystalline substrate 15 is arranged which is movable along with the carrier 16. Note that the extension of the substrate 15 in FIG. 1 is merely schematic and may be chosen differently, in particular so as to not cover the whole area of the carrier 16. The powder application device 14 deposits a first raw material powder layer directly onto said substrate 15. Further raw material powder layers may then be subsequently deposited on top of said first raw material powder layer according to known additive layer manufacturing processes and especially according to known selective laser melting processes. The workpiece to be produced may thus be build up in a positive direction along the vertical Z-axis of FIG. 1 which forms a build axis.

The substrate 15 is provided with a uniform crystal orientation which corresponds to the build axis, thus extending along the Z-axis. This is valid for the following cases of two directional scanning or unidirectional scanning with a rotation angle of 90°, 180° or 270°, whereas in case of unidirectional scanning with 0°-rotation, the substrate may be oriented differently. Other than that, the substrate 15 extends within the X-Y plane of FIG. 1 and covers a portion of the build area that can be used for generating workpiece layers. Again, the size of the substrate 15 in FIG. 1 is merely schematic and may be significantly smaller than that of the build area.

The apparatus 10 further comprises an irradiation device 18 for selectively irradiating laser radiation onto the deposited raw material powder. By means of the irradiation device 18, the deposited raw material powder may be subjected to laser radiation in a site-selective manner in dependence on the desired geometry of the workpiece that is to be produced.

The irradiation device 18 has a hermetically sealable housing 20. A laser beam 22 provided by a laser source 24 which may, for example, comprise a diode pumped Ytterbium fibre laser emitting laser light at a wavelength of approximately 1070 to 1080 nm is directed into the housing 20 via an opening 26.

The irradiation device 18 further comprises an optical unit 28 for guiding and processing the laser beam 22, the optical unit 28 comprising optical elements such as a beam expander 30 for expanding the laser beam 22, a focusing lens 32 for focusing the laser beam 22 at a focus point and a scanner unit 34. The scanner unit 34 and the focus lens 32 are shown by way of example in the form of a galvanometer scanner and an f-theta object lens. By means of the scanner unit 34, the position of the laser beam 22 can be changed and adapted for moving said beam across a deposited raw material powder layer according to predetermined scan pattern discussed below. For example, the irradiation device 18 may be an irradiation device as described in EP 2 335 848 A1.

In addition, the apparatus 10 comprises a heating device 37 for preheating the raw material powder prior to irradiating the laser beam 22 onto the raw material powder. The position of the heating device 37 could be selected differently, so as to e.g. be arranged below of the carrier 16 or arranged at a ceiling portion of the build chamber 12 and facing the carrier 16.

Figure 2:
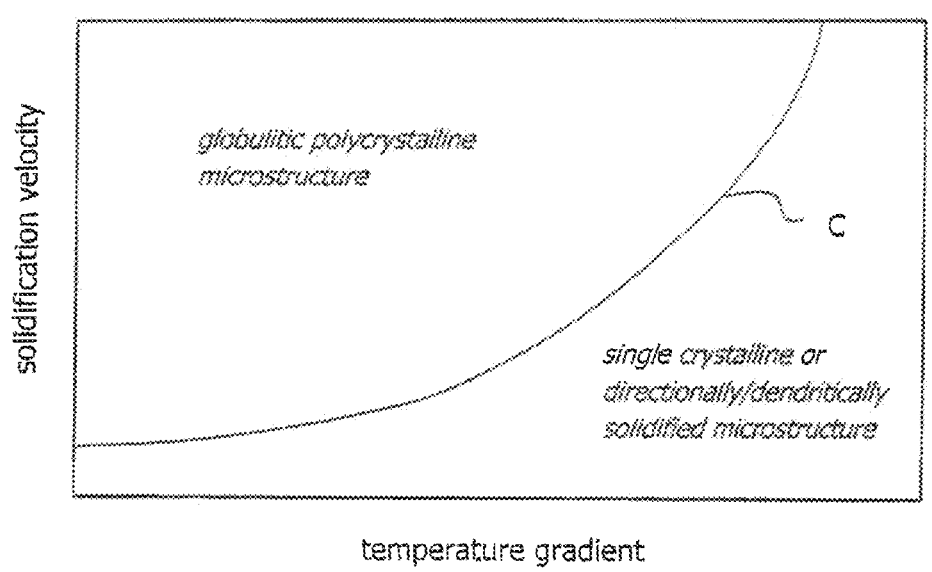
FIG. 2 shows, in schematic form, a v-G-diagram, wherein the solidification or crystal growth velocity v in a metallic melt is plotted against the temperature gradient G in the melt.

Finally, the apparatus 10 comprises a control unit 38 which is adapted to control the operation of the powder application device 14 and the irradiation device 18 in dependence on the crystallization behavior of the raw material powder, in order to tailor the microstructure of a workpiece made of said raw material powder by an additive layer construction method. The crystallization behavior of a metallic melt, may be described a v-G-diagram, which, in schematic form, is illustrated in FIG. 2, In the v-G-diagram, a solidification or crystal growth velocity v is plotted against the temperature gradient G, typically on a double logarithmic scale. A v-G-diagram may be measured or calculated for any desired material, as it is well known in the art. In the schematic v-G-diagram of FIG. 2, a curve C separates an areal region of the diagram, wherein the combination of high solidification or crystal growth velocities and low temperature gradients lead to the development of a polycrystalline globulitic microstructure, from an areal region of the diagram, wherein the combination of low solidification or crystal growth velocities and (local) undercooling of the melt due to high temperature gradients result in the formation of dendrites and single crystals. With regard to the present embodiment, these temperature gradients particularly relate to temperature gradients in the negative Z-direction of FIG. 1.

The control unit 38 of the apparatus 10 thus is adapted to control the operation of the powder application device 14 and the irradiation device 18 in such a manner that, in dependence on the raw material powder type, a suitable combination of the solidification or crystal growth velocity and the temperature gradient occurring in the melt produced by irradiating the powder with the laser beam 22 is obtained in order to generate the desired microstructure, and in particular a directionally solidified microstructure comprising substantially dendrites and/or single crystals.

Specifically, the control unit 38 is adapted to control the laser source 24 and the optical unit 28 so as to adjust different operating parameters of the laser source 24 and the optical unit 28 in dependence on the crystallization behavior of the raw material powder, in order to tailor the microstructure of a workpiece made of said raw material powder by an additive layer construction method. The operating parameters of the laser source 24 and the optical unit 28 which may be controlled by means of the control unit 38 include a beam size, in particular a beam diameter, of the laser beam 22 irradiated onto the raw material powder applied onto the carrier 16 and a beam profile of a laser beam 22 irradiated onto the raw material powder applied onto the carrier 16.

For example, the beam size of the laser beam 22 may be increased under the control of the control unit 38 in order to promote the occurrence of a low solidification or crystal growth velocity in combination with a high temperature gradient in the melt produced by irradiating the powder and to thus obtain a substantially single crystalline or directionally/dendritically solidified microstructure in the generated workpiece. Additionally or alternatively thereto, it is conceivable to promote the occurrence of a low solidification or crystal growth velocity in combination with a high temperature gradient in the melt and thus the formation of a substantially single crystalline or directionally/dendritically solidified microstructure in the generated workpiece by changing the beam profile of the laser beam 22.

Further, the operating parameters of the laser source 24 and/or the optical unit 28 which may be controlled by means of the control unit 38 include a moving speed of an irradiation site (presently corresponding to a scan speed) across the deposited raw material powder and/or a radiation or scan pattern of the laser beam 22. For example, the moving speed may be set under the control of the control unit 38 in order to promote the occurrence of a low solidification or crystal growth velocity in combination with a high temperature gradient in the melt produced by irradiating the powder and to thus obtain a substantially single crystalline or directionally/dendritically solidified microstructure in the generated workpiece. For doing so, a moving speed between 50-500 mm/s may be chosen.

Additionally or alternatively thereto, it is conceivable to promote the occurrence of a low solidification or crystal growth velocity in combination with a high temperature gradient in the melt and thus the formation of a substantially single crystalline or directionally/dendritically solidified microstructure in the generated workpiece by setting the distance between hatches (or scan vectors) along which the laser beam 22 is guided over the powder surface. Said distance may be chosen to be less than a beam diameter of the laser beam 22 or, as a general example, may be less than 1 mm.

Finally, a laser power of the laser source 24 may be controlled by means of the control unit 38 in such a manner that, in dependence on the raw material powder type, a suitable combination of the solidification or crystal growth velocity and the temperature gradient occurring in the melt produced by irradiating the powder is obtained in order to generate the desired microstructure. Specifically, the laser power of the laser source 24 may be increased under the control of the control unit 38 in order to promote the occurrence of a low solidification or crystal growth velocity in combination with a high temperature gradient in the melt and thus the formation of a substantially single crystalline or directionally/dendritically solidified microstructure in the generated workpiece.

The control unit 38 further is adapted to control the operation of the carrier 16 in connection with an operation of the powder application device 14 so as to adjust a thickness of a raw material powder layer applied onto the carrier 16 in dependence on the crystallization behavior of the raw material powder, in order to tailor the microstructure of a workpiece made of said raw material powder by an additive layer construction method. For example, the operation of the carrier 16 may be controlled so as to move by a predetermined amount in the negative Z-direction, said amount corresponding to the thickness of the raw material powder layer being deposited by means of the powder application device 14. Specifically, the thickness of the raw material powder layer applied onto the carrier may be set to a value between 50-250 µm, if it is desired to promote the occurrence of a low solidification or crystal growth velocity in combination with a high temperature gradient in the melt and thus the formation of a substantially single crystalline or directionally/dendritically solidified microstructure in the generated workpiece.

Moreover, the control unit is adapted to control the heating device 37 so as to adjust a preheating temperature of the raw material powder in dependence on the crystallization behavior of the raw material powder, in order to tailor the microstructure of a workpiece made of said raw material powder by an additive layer construction method.

Finally, the control unit 38 is adapted to control any of the above discussed parameters such that a grain growth direction of the irradiated and thereby melted raw material powder layers corresponds to a crystal orientation of the substrate 15. In the present case, this means that the control unit 38 sets the above parameters such that a grain growth direction along the build axis is achieved.

In sum, the single-crystalline substrate 15 thus promotes a single-crystalline microstructure of the workpiece layers produced from the raw material powder deposited thereon. This single-crystalline microstructure and the associated grain growth is maintained when depositing and irradiating subsequent raw material powder layers by means of suitably setting the above-discussed parameters with the control unit 38.

For doing so, a very thin top surface layer of the single-crystalline substrate 15 is melted when irradiating a raw material powder layer being deposited first and directly onto the substrate 15. This way, a metallurgical bond forms between said surface layer of the single-crystalline substrate 15 and the melted powder material of the first layer. Due to the deposited material having a preferred crystal orientation in three dimensions according to the applied scanning pattern, and when said orientation matches an orientation of the single-crystalline substrate 15 in three dimensions, the microstructure of the melted powder material will epitaxially grow along this preferred orientation to produce an overall single-crystalline workpiece. Overall, it is not mandatory that the substrate 15 has a respective single-crystalline microstructure. However, this may allow for a particularly efficient production of a single-crystalline microstructure within the produced workpiece layer.

EXAMPLE 1

A predominantly single-crystalline workpiece having a height along the build axis Z of about 10 mm has been generated from the material IN738LC with the device of FIG. 1. This material has been used both for the substrate 15 as well as the raw material powder deposited thereon.

Alternatively, the substrate and powder material may have a different chemical composition form one another, wherein the substrate is single-crystalline.

For producing workpieces based on this powder material and substrate, suitable ranges for the relevant process parameters have been identified. Specifically, the laser power has been set to 500-1000 W, the scan speed has been set to 50-500 mm/s, a hatch distance between adjacent scan vectors has been set to 100-500 μm and the layer thickness of the deposited raw material powder has been set to 50-250 μm.

Furthermore, these parameters have been set so that a remelting rate Rz along the build axis Z fulfils the following condition: Rz>0.3 and a remelting rate within the plane of a presently irradiated raw material powder layer Rx fulfils the following condition: Rx>0.3. Said remelting rates are determined as discussed above.

Moreover, it has been found that good results are still achieved when only setting one of the remelting rates in this manner.

Overall, according to this example, a single-crystalline workpiece has been produced with an improved quality and a higher reliability while using the single-crystalline substrate 15.

In the context of the present application, further measures have been identified for promoting the production of a single crystalline microstructure. This will be discussed with reference to FIGS. 3 and 6.

First of all, it has been observed that with regard to subsequently deposited or adjacent raw material powder layers, the rotation angle between the scan patterns (or hatch directions) for irradiating said layers represents a crucial parameter for affecting the growth of a single crystalline microstructure. A possible explanation is the thermal gradient generated in the melt pool in this manner.

Figure 3:
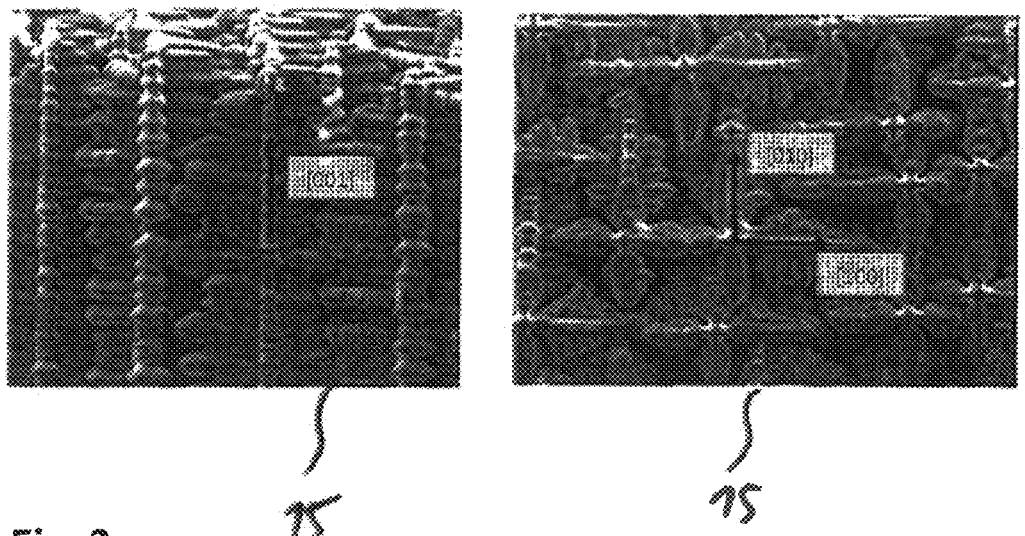
FIG. 3 shows crystal orientations within a substrate.

In FIG. 3, a microscopic view of the microstructure of the single crystal substrate 15 is shown from different angles (i.e., with views onto different planes or cross sections of the microstructure). In the left half, a side view is shown for identifying a [0 0 1] crystal orientation extending along the primary dendrites' growth direction. This direction corresponds to a Z- or build axis of the workpiece, i.e. an axis along which the raw material powder layers are stacked and/or an axis extending orthogonally with respect to said layers. With regard to FIG. 1, this direction and axis corresponds to a vertical direction in space. Note that this is valid for the following cases of two directional scanning or unidirectional scanning with a rotation angle of 90°, 180° or 270°, whereas in case of unidirectional scanning with 0°-rotation, the substrate may be oriented differently.

In the right half of FIG. 3, a top view onto the substrate 15 is shown for identifying the [0 1 0] and [1 0 0] directions extending along the secondary dendrite arm growth directions.

In general, the views of FIG. 3 as well as the identification of the crystal orientations can be achieved by metallographic methods, such as polishing and etching, or by EBSD methods (electron backscatter diffraction). By way of the presently disclosed solution, the preferred crystal growth orientation of the deposited raw material may be chosen so as to match the substrate crystal orientation, said growth direction being influenced by applying a suitable scanning and/or rotation strategy.

Figure 4:
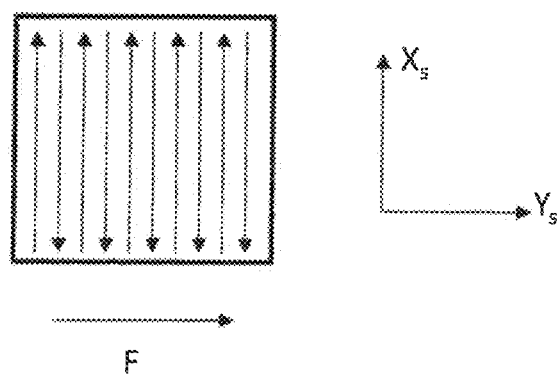
FIG. 4 shows an example of a two directional scan pattern.

In FIG. 4, an example of a two directional scan pattern is shown. Said pattern includes a plurality of straight scan vectors extending in parallel to one another and being equidistantly spaced apart from one another. Also, adjacent scan vectors of said scan pattern point in opposite directions. A forward moving direction F is indicated by a single arrow F. Said direction F indicates a sequence according to which an irradiation along the single scan vectors takes place (e.g. from left to right in FIG. 4).

The scan pattern is marked by a coordinate system comprising the axes $X_s$, $Y_s$, $Z_s$. The $X_s$-axis extends in parallel to the scan vectors and points the same direction as the first scan vectors along which an irradiation takes place (i.e., the leftmost scan vector in FIG. 4 from which the moving direction F commences). The $Y_s$-axis extends orthogonally to the $X_s$-axis and thus in parallel to the forward moving direction F. The $Z_s$-axis which is not specifically marked in FIG. 4 corresponds to the build axis of the workpiece, thus extending orthogonally to both of the $X_s$- and $Y_s$-axis. Note that a corresponding coordinate system can also be defined for a unidirectional pattern as e.g. included in the subsequent FIG. 5.

Figure 5:
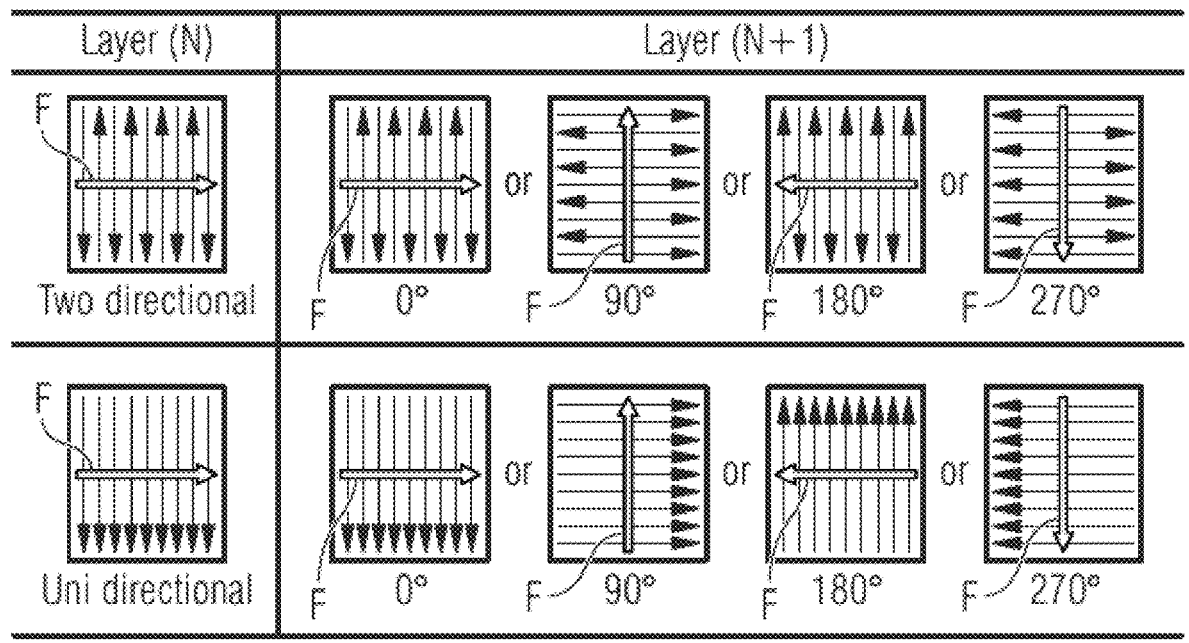
FIG. 5 shows rotations of scan patterns for subsequently deposited and thus adjacent material powder layers.

FIG. 5 includes examples of a two directional and of a unidirectional scan pattern applied to a presently irradiated layer marked N. Both of these patterns include a number of equidistantly spaced, straight and parallel scan vectors. For the two directional pattern, adjacent scan vectors point in opposite directions, whereas in the unidirectional pattern, always the same direction is applied. Also, for each of the patterns, a forward moving direction F is indicated by a single arrow F. Said direction F indicates a sequence according to which an irradiation along the single scan vectors takes place (e.g. from left to right in the examples for layer N).

For each of the scan patterns N, preferable rotation angles of a subsequent layer N+1 are listed. In both cases, said rotation angles may be 0° or 90° or 180° or 270° with a tolerance in each case of +/−15°. In the shown examples, the respective angle is measured in a counterclockwise direction, see in particular the 0° and 90° patterns for the unidirectional scan pattern.

As a general aspect, the method may consider choosing the orientation of the scan pattern (or, differently put, its hatching direction) with respect to a predetermined crystal orientation of the substrate 15. In this context, a [1 0 0] crystal orientation is identified first by a standard microscopic examination and as previously explained with reference to FIG. 3. Accordingly, said crystal orientation relates to a common microstructure coordinate system in which the main growth direction of the dendrites represents the [0 0 1] direction and orientation. The [1 0 0] and [0 1 0] orientations extent orthogonally thereto as well as to one another and represent the growth direction of the secondary dendrite arms (see FIG. 3).

In the following, different cases are discussed in which the crystal orientation of the substrate 15, the scan pattern and a rotation thereof are adjusted to one another, so as to produce a single crystalline workpiece. These cases may be distinguished from one another in particular with regard to whether a unidirectional or a two directional scan pattern is used. Depending on the applied scan pattern, e.g. rotation thereof may be adapted accordingly.

Figure 6:
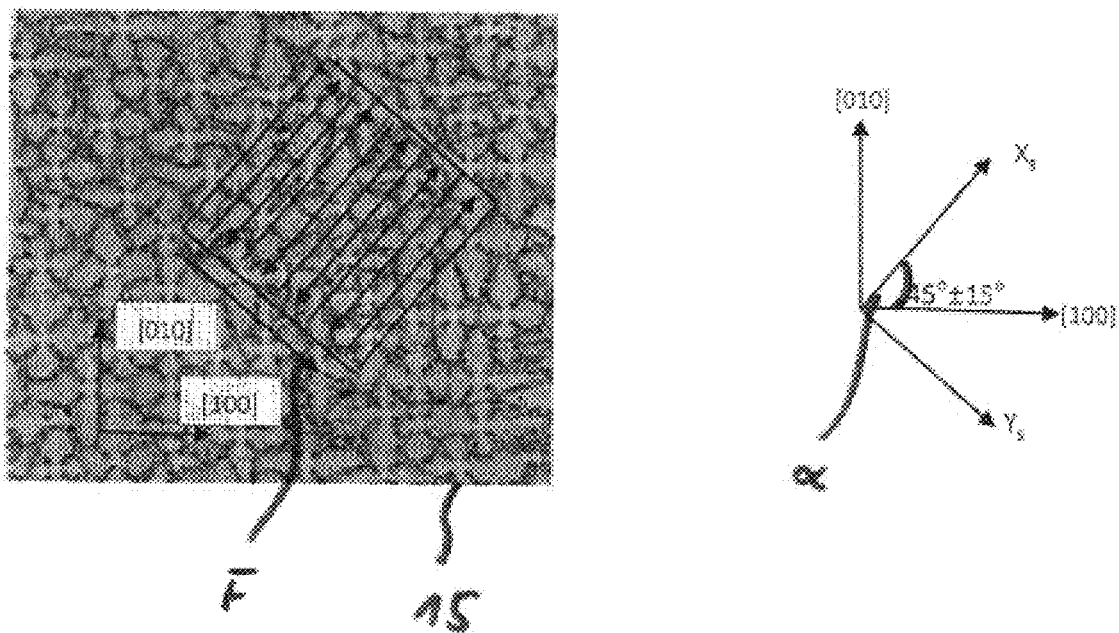
FIG. 6 shows choosing the orientation of the scan pattern with respect to a crystal orientation of the substrate.

In FIG. 6, the microstructure of the substrate 15 is indicated and the respective [1 0 0] crystal orientation is marked by a coordinate system next to said microstructure. Also, a two directional scan pattern is shown which again includes an arrow F for marking the associated forward moving direction F. This two directional scan pattern is applied to the first and thus lowermost raw material powder layer which is directly deposited onto the substrate 15. The two directional scan pattern is again marked by a $X_s$, $Y_s$, $Z_s$-coordinate system as discussed with respect to FIG. 4. Accordingly, the scan vectors extend in parallel to the $X_s$-axis whose orientation is indicated in the coordinate system in the left half of FIG. 4. Thus, it is evident that the scan vectors and thus the scan pattern extend at an angle $\alpha$ of 45° with respect to the [1 0 0] crystal orientation of the substrate 15, said angle $\alpha$ having a tolerance of +1-15°. Even though it is not indicated in FIG. 6, the same angle is also present with respect to the [0 1 0], [4 0 0] and [0 0] crystal orientation.

To sum up, in the above example the substrate 15 is first arranged so that its [0 0 1] orientation matches the build axis (and thus $Z_s$-axis), wherein said matching may again have a tolerance of +/−15°. Following that, the scan pattern is chosen to be a two directional scan pattern. As explained with respect to FIG. 6, the orientation of the scan pattern is then adapted to the crystal orientation of the substrate 15 in a specific manner. Afterwards, the layer-by-layer production of the workpiece may commence. It has been determined that in this manner, a single crystalline workpiece can be produced with a high reliability.

Note that for doing so, the above example does not necessarily require a rotation of the two directional scan pattern between subsequent layers, i.e. the rotation angle may be 0° throughout the workpiece, with a tolerance of +1-15° again being possible.

In a different embodiment, a unidirectional scan pattern is chosen. In this case, different substrate-orientations may be chosen depending on the applied rotation angle. For example, when applying unidirectional scanning and a rotation angle of 90°, 180° or 270°, the substrate 15 is again arranged so that its [0 0 1] orientation matches the build axis (and thus $Z_s$-axis), wherein said matching may again have a tolerance of +/−15°. On the other hand, the angle $\alpha$ of the scan pattern relative to the substrate 15 does not necessarily have to be chosen as explained with reference to FIG. 6 but may have a different value.

As noted above, the rotation angle of the unidirectional scan pattern between subsequent raw material powder layers may be 90°, 180° or 270° with a tolerance in each case of +/−15°. As further detailed below, a rotation angle of 0° with a similar tolerance is equally contemplated. The value of the applied rotation angle may remain constant throughout the workpiece or may be switched, e.g. after a predetermined number of layers.

As a further option when applying a unidirectional scan pattern, a preferred growth orientation of the deposited and solidified material may be identified in advance, e.g. by building samples with a similar scanning strategy on a comparatively cheap polycrystal substrate plate. From this sample, the [1 0 0] and [0 1 0] orientations can be identified as explained with reference to FIG. 3, said orientations representing the preferred growth orientations of the deposited material. The single-crystal substrate 15 can then be arranged to match the identified [1 0 0] and [0 1 0] orientations in the irradiation plane with a tolerance of +1-15°. Following that, an orientation and/or rotations of the scan pattern may be chosen as explained above.

For the unidirectional scan pattern, the rotation angle may also be chosen at 0° with a tolerance of +/−15°. In this case, however, the [0 0 1] orientation of the substrate 15 does not necessarily have to be arranged along the build and $Z_s$-axis (which may optionally still be considered). Rather, the preferred growth orientation of the deposited raw material can be identified in three axis in advance in the previously described manner (i.e., by identifying the [1 0 0], [0 1 0] and [0 0 1] orientations). The substrate 15 can then be arranged to match each of these preferred orientations, i.e. matching said orientations in three dimensions.

Overall, the inventors have discovered that when choosing the scan patterns accordingly and possibly rotating it as explained above, a single crystalline microstructure can be produced with a high quality and high reliability.

As a concluding example, the following experimental setting is noted in which the disclosed method produced very satisfying results. The powder material was chosen to be IN718 and the single-crystal substrate was made of IN738LC. Samples were produced with a so-called Hull and Core method, the samples having a geometry of 13 mm*13 mm*26 mm (i.e., the build height being more than 20 mm). Two directional scanning was applied according to the above embodiment (i.e., with a predetermined orientation of the scan pattern with respect to the crystal orientation of the substrate and a rotation angle of 90°). The resulting microstructure in the core was homogeneous from bottom to top. The same could also be observed when applying unidirectional scanning according to the above embodiments.

The invention claimed is:
1. A method for producing or repairing a three-dimensional workpiece, the method comprising the following steps:
  depositing a sequence of layers of a raw material powder onto a substrate;
  after depositing a raw material powder layer, irradiating selected areas of said deposited raw material powder layer with an electromagnetic or particle radiation beam in a site selective manner in accordance with an irradiation pattern which corresponds to a geometry of at least part of a layer of the three-dimensional workpiece to be produced, said irradiation pattern comprising a scan pattern,
  wherein
  the substrate has a substantially single-crystalline microstructure;
  the irradiation is controlled so as to maintain said single-crystalline microstructure and to produce a metallurgical bond between irradiated sites of the raw material powder layer and the substrate and/or a previously deposited raw material powder layer;
  the method comprising the further steps of:
  defining the scan pattern to be a two directional scan pattern,
  orienting the scan pattern such that it extends at an angle of 45° with respect to a predetermined crystal orientation of the substrate, said angle having a tolerance of +/−15°, wherein said predetermined crystal orienta- tion is one of a [1 0 0] orientation, [0 1 0] orientation, [−1 0 0] orientation, and [0 −1 0] orientation, and choosing a rotation angle of the scan pattern between two subsequently deposited raw material powder layers to be 0° throughout the workpiece, said rotation angle having a tolerance of +/−15°.

2. The method according to claim 1, wherein the scan pattern comprises a plurality of scan vectors.

3. The method according to claim 1, wherein the substrate is arranged so that the [0 0 1] orientation matches a build axis of the workpiece.

4. The method according to claim 2, wherein each scan vector has a straight course.

\* \* \* \* \*